United States Patent
Reit et al.

(10) Patent No.: US 10,840,120 B2
(45) Date of Patent: Nov. 17, 2020

(54) TEMPORARY BONDING LAYER FOR FLEXIBLE ELECTRONICS FABRICATION

(71) Applicant: ARES MATERIALS INC., Dallas, TX (US)

(72) Inventors: Radu Reit, Carrollton, TX (US); David Arreaga-Salas, Garland, TX (US)

(73) Assignee: ARES MATERIALS INC., Dallas, TX (US)

( * ) Notice: Subject to any disclaimer, the term of this patent is extended or adjusted under 35 U.S.C. 154(b) by 0 days.

(21) Appl. No.: 16/462,891

(22) PCT Filed: Nov. 27, 2017

(86) PCT No.: PCT/US2017/063274
§ 371 (c)(1),
(2) Date: May 21, 2019

(87) PCT Pub. No.: WO2018/098430
PCT Pub. Date: May 31, 2018

(65) Prior Publication Data
US 2019/0305239 A1 Oct. 3, 2019

Related U.S. Application Data

(60) Provisional application No. 62/426,927, filed on Nov. 18, 2016.

(51) Int. Cl.
*H01L 21/68* (2006.01)
*H01L 21/683* (2006.01)
(Continued)

(52) U.S. Cl.
CPC ...... *H01L 21/6835* (2013.01); *B32B 17/1055* (2013.01); *B32B 37/26* (2013.01);
(Continued)

(58) Field of Classification Search
CPC . H01L 51/0097; H01L 21/6835; H01L 23/24; H01L 27/1266; H01L 2221/6835;
(Continued)

(56) References Cited

U.S. PATENT DOCUMENTS

2006/0199353 A1  9/2006  Kub et al.
2007/0235074 A1* 10/2007  Henley ............... H01L 31/0232
                                            136/252
(Continued)

FOREIGN PATENT DOCUMENTS

WO  2014031374 A1  2/2014

OTHER PUBLICATIONS

International Search Report & Written Opinion for corresponding International Application No. PCT/US2017/063274 dated Feb. 15, 2018. (18 pages).

*Primary Examiner* — Matthew L Reames
(74) *Attorney, Agent, or Firm* — McGuireWoods LLP

(57) ABSTRACT

Provided are microelectronics substrates and methods of manufacturing and using the microelectronics substrate. An example of a microelectronics substrate includes a carrier, a silicate bonding layer, and a flexible substrate, wherein the flexible substrate is bonded to the silicate bonding layer. The microelectronics substrate comprises a peel strength between the flexible substrate and silicate bonding layer; wherein the peel strength between the flexible substrate and the silicate bonding layer is below 1 kgf/m.

8 Claims, 3 Drawing Sheets

(51) Int. Cl.
*B32B 17/10* (2006.01)
*B32B 37/26* (2006.01)
*H01L 27/12* (2006.01)
*H01L 23/24* (2006.01)

(52) U.S. Cl.
CPC .......... *H01L 23/24* (2013.01); *H01L 27/1266* (2013.01); *H01L 2221/6835* (2013.01); *H01L 2221/68395* (2013.01)

(58) Field of Classification Search
CPC ....... H01L 2221/68395; B32B 17/1055; B32B 37/26
See application file for complete search history.

(56) References Cited

U.S. PATENT DOCUMENTS

| | | |
|---|---|---|
| 2009/0200550 A1 | 8/2009 | Kerr et al. |
| 2009/0246355 A9 | 10/2009 | Lower et al. |
| 2013/0071650 A1 | 3/2013 | Liu et al. |
| 2016/0071756 A1* | 3/2016 | Moore ................ H01L 21/6835 269/289 R |

* cited by examiner

TEMPORARY BONDING LAYER FOR FLEXIBLE ELECTRONICS FABRICATION

BACKGROUND

The fabrication of microelectronics atop a flexible substrate typically requires a carrier as flexible substrates can deform at temperatures achieved during the microfabrication process, yet the fabrication also requires the dimensional stability for high-fidelity photolithographic definition. One layer used during this fabrication process is the interim adhesion layer present between the carrier and the flexible substrate. Such a layer provides sufficient adhesion, thermal stability and chemical compatibility for withstanding the conditions observed by the carrier and flexible substrate during photolithographic processing, while exhibiting reversing adhesion under a mild stimulus once the microfabrication is complete.

BRIEF SUMMARY

In the presently disclosed subject matter, a microelectronics substrate and method of manufacture is provided. The microelectronics substrate comprises a carrier and flexible substrate coupled by a silicate bonding layer. A method of manufacture comprises desolvating a silicate solution to deposit a silicate bonding layer between a carrier and a flexible substrate. The deposited silicate bonding layer provides sufficient adhesion between the carrier and the flexible substrate for any subsequent photolithographic processing of microelectronics. In some embodiments, once manufacture of a flexible electronics stack has been completed, the method may further comprise resolvating the silicate bonding layer to lower an adhesive force between the carrier and flexible substrate to below 1 kgf/m and delaminating the carrier from the flexible substrate.

In an embodiment, a silicate bonding layer acts as a temporary bonding agent for microelectronics substrates. The silicate bonding layer forms an adhesive which may be removed with a peel strength less than 1 kgf/m during a delamination process.

In another embodiment, a method to remove a flexible electronics stack from a carrier after fabrication includes introducing a solvent to dissolve a silicate bonding layer adhering the flexible electronics stack to the carrier. Further, the method includes mechanically removing the flexible electronics stack with a removal force below 1 kgf/m.

BRIEF DESCRIPTION OF THE DRAWINGS

Illustrative embodiments of the present disclosure are described in detail below with reference to the attached drawing figures, which are incorporated by reference herein, and wherein.

Figure 1:
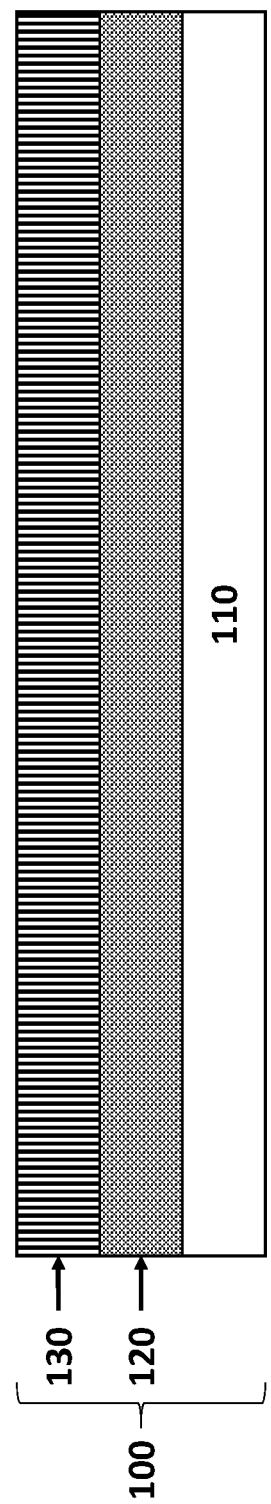
FIG. 1 is a side view of a microelectronics substrate, including a carrier with a silicate bonding layer and a flexible substrate.

The illustrated figures are only exemplary and are not intended to assert or imply any limitation with regard to the environment, architecture, design, or process in which different embodiments may be implemented.

DETAILED DESCRIPTION

In the following detailed description of the illustrative embodiments, reference is made to the accompanying drawings that form a part hereof. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments is defined only by the appended claims.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, steps, operations, elements, and/or components, but do not preclude the presence or addition of one or more other features, steps, operations, elements, components, and/or groups thereof. In addition, the steps and components described in the above embodiments and figures are merely illustrative and do not imply that any particular step or component is a requirement of a claimed embodiment.

Unless otherwise specified, any use of any form of the terms "connect," "engage," "couple," "attach," or any other term describing an interaction between elements is not meant to limit the interaction to direct interaction between the elements and may include indirect interaction between the elements described. In the following discussion and in the claims, the terms "including" and "comprising" are used in an open-ended fashion, and thus should be interpreted to mean "including, but not limited to". Unless otherwise indicated, as used throughout this document, "or" does not require mutual exclusivity.

The present disclosure relates to the manufacture of a flexible electronics stack. In particular, the present disclosure relates to methods for the deposition and usage of a silicate bonding layer in the manufacture of the flexible electronics stack. The silicate bonding layer provides sufficient adhesion, thermal stability, and chemical compatibility for withstanding conditions observed by a carrier and a flexible substrate during photolithographic processing, while exhibiting reversible adhesion under a mild stimulus once microfabrication of the flexible substrate is complete. One class of materials that fulfills these criteria are silicates. The silicates can be solvated in mild solvents and deposited on a carrier via industrially-scalable processes such as spin-coating, slot-die coating, blade coating, or any other suitable coating technique. Once the solvent is evaporated, a thin layer of the silicate remains as the primary interfacing layer between the carrier and the subsequently deposited flexible substrate. Finally, after microfabrication, the flexible substrate may be removed from the carrier with minimal (e.g., less than 1 kgf/m) tensile loading via the partial-solubilization of the silicate bonding layer.

In general, the silicate solutions may be utilized as bonding layers between the carrier (e.g., glass panel, silicon wafer, etc.) and the flexible substrate (e.g., polyimides, polysulfides, polyesters, etc.). The silicate solution may be dispensed atop the carrier and desolvated to form a silicate bonding layer. Atop the silicate bonding layer of the bilayer, a precursor solution to the flexible substrate may be deposited via a coating solution (e.g., spin-coating, slot-die coating, blade coating, etc.) and cured into a film. After microfabrication atop the flexible substrate, the silicate bonding layer may be dissolved via the introduction of solvent at the interface between the flexible substrate and the silicate bonding layer. Subsequently, the flexible substrate may then be removed from the carrier via mechanical debonding (e.g., vacuum roll release, blade release, tensile grip etc). Generally, vacuum roll release involves the use of a roller having an array of vacuum ports, attaching the roller to the flexible substrate, initiating vacuum contact between the flexible substrate and the vacuum roller, and rolling the vacuum roller normal to the curved face until the flexible substrate is completely detached from the carrier. Bladed release involves the introduction of a blade at the interface of the flexible substrate and the silicate bonding layer. An optional solvent may be introduced at this interface to reduce the release strength of the flexible substrate. The blade can then be pushed further into the interface between the flexible substrate and the silicate bonding layer until the flexible substrate is completely detached from the carrier. Tensile grip release involves the partial detachment of the flexible substrate from the carrier via another method (such as vacuum roll release or bladed release) and then attaching the partially released flexible substrate to a tensile grip. The tensile grip can then be pulled at a constant rate until the flexible substrate is completely detached from the carrier.

The temporary bonding of a flexible substrate to a carrier may be utilized to prevent the migration and deformation of the flexible material during the elevated temperatures of the microfabrication processes. The temporary bonding of the flexible substrate to the carrier allows for microfabrication to be performed at elevated temperatures, and also the use of aqueous and organic solutions to which the flexible substrates will be exposed. The bond formed from the silicate bonding layer is reversible after microfabrication has been completed. The bond may be removed via the introduction of stimuli that will not disrupt the sensitive components built atop the flexible substrate. In the presently disclosed subject matter, mechanical removal via application of a low removal force (<1 kgf/m) may be achieved after the silicate bonding layer has been dissolved. This mechanical removal and preceding resolvation process may not disrupt or otherwise impeded the use and functionality of the microelectronics fabricated on the flexible substrate.

The desolvation of the silicate solution allows for the deposition of a glass-like film atop the carrier. The formed silicate bonding layer provides a thermally-stable (>1000° C.) layer upon which the flexible substrate may be coated. After the introduction of solvent at the interface of the silicate bonding layer and the flexible substrate, the silicates within the silicate bonding layer may be partially-solubilized again into a silicate solution which can be drained or otherwise removed. This dissolution allows for the dissociation of any adhesive forces between the flexible substrate and the silicate bonding layer (e.g., covalent, ionic, van der Waals, etc.) and reduces the overall force needed to remove the flexible substrate from the carrier.

In one embodiment, the silicate solution comprises alkali metal silicates including, but not limited to, lithium silicate, sodium silicate, potassium silicate, rubidium silicate, cesium silicate, francium silicate, or any combinations thereof. In another embodiment, the silicate solution comprises alkaline earth metal silicates including, but not limited to, beryllium silicate, magnesium silicate, calcium silicate, strontium silicate, barium silicate, radium silicate, or any combinations thereof. In a further embodiment, the silicate solution comprises a combination of alkali metal silicates and alkaline earth metal silicates. In examples, the silicate(s) is solubilized in water to form a 0.01 to 50% w/w silicate solution, which may be dispensed atop a carrier via a coating method (e.g., spin-coating). The produced film may then be desolvated by increasing temperature (e.g., exposure to 125° C. for 10 minutes) or other method to form the silicate bonding layer. After the silicate bonding layer is formed, the flexible substrate may be formed atop the silicate bonding layer. In one embodiment, the flexible substrate is formed by solution coating and curing a flexible substrate material atop the silicate bonding layer. After microfabrication, the silicate bonding layer between the flexible substrate and the carrier may be exposed via mechanical excision, and water or other solvent may be introduced at the interface to resolvate the silicate. The flexible substrate may then be removed from the carrier via a tensile force less than 1 kgf/m as measured at or below a 90° angle between the carrier and the released flexible substrate. An applied release force resulting from the tensile force and the angle between the carrier and the flexible substrate may be calculated using the following equation:

$$\text{Applied Release Force} = \text{Tensile Force} * \cos(\theta) \quad (1)$$

where θ is the angle between the carrier and the released flexible substrate.

In one specific example, sodium silicate is solubilized in water to form a 0.01 to 50% w/w sodium silicate solution, which can be dispensed atop a carrier of a silicon wafer via a coating method (e.g., spin-coating). The spun film is then dehydrated by exposure to a temperature of 125° C. for 10 minutes, after which the flexible substrate is formed upon the sodium silicate layer. In this specific embodiment, the flexible substrate material is formed by solution coating and curing a flexible substrate material atop the sodium silicate bonding layer. After microfabrication, the sodium silicate layer between the flexible substrate and the carrier can be exposed via mechanical excision, and water can be introduced at the interface to rehydrate the sodium silicate in the sodium silicate layer. The flexible substrate can now be removed from the carrier via a tensile force less than 1 kgf/m as measured at or below a 90° angle between the carrier and the released flexible substrate.

In another specific embodiment, a magnesium silicate solution is solubilized in 0.1N hydrochloric acid to form a 1% w/w magnesium silicate solution, which can be dispensed upon a silicon wafer via spin-coating. The spun film is then desolvated by exposure to 125° C. for 10 minutes, after which the flexible substrate is formed atop the magnesium silicate bonding layer. In this specific embodiment, the flexible substrate material is formed by solution coating and curing a flexible substrate material atop the magnesium silicate bonding layer. After microfabrication, the magnesium silicate bonding layer between the flexible substrate and the carrier can be exposed via mechanical excision, and 0.1N hydrochloric acid can be introduced at the interface to resolvate the magnesium silicate bonding layer. The flexible substrate can now be removed from the carrier via a tensile force not to exceed 1 kgf/m as measured at or below a 90° angle between the carrier and the released flexible substrate.

In one embodiment, the flexible substrate is a solution processed organic material such as a resin, a varnish, or any combinations thereof. In another embodiment, the solution may be converted into a flexible substrate by the removal of the solvent in the varnish. In a specific embodiment, the removal of the solvent is achieved by increasing the ambient temperature, decreasing the ambient pressure, or any combination thereof. In another embodiment, the solution may be converted into a flexible substrate by polymerization of a resin. In a specific embodiment, the polymerization of the resin may be initiated by exposure to electromagnetic radiation, humidity, time, or any combination thereof.

In one embodiment, microfabrication can be further performed atop the flexible substrate. Microfabrication may include thin-film deposition, thin-film growth, thin-film patterning, wet etching, dry etching, microforming or any combination thereof. In specific embodiments, microfabrication may form transparent conductive oxides, color filter arrays, thin-film transistor arrays, or any other microelectronic arrays.

Removal of the flexible substrate from the carrier may be conducted via a three-step process, with the first step being optional depending on a substrate modulus. First, an optional mechanical excision step is performed to expose the interfacial silicate bonding layer around the perimeter of the flexible substrate. This method can be performed via a variety of mechanical (e.g., rotary sawing), electromagnetic (e.g., laser ablation), or fluidic (e.g., water jet) methods. While this step can aid in the removal of a flexible electronics stack if the flexible substrate completely covers the silicate bonding layer, it may not be necessary if the silicate bonding layer is capable of being exposed to a solvent without the excision step.

Next, the solvation of the silicate bonding layer is conducted to reduce the interfacial adhesive force between the silicate bonding layer and the flexible substrate. The solvation may occur with the original solvent of the silicate solution, or a different solvent that can reduce the adhesive force depending on the solubility parameters of the silicate bonding layer. Solvation may occur via the introduction of liquid solvent at the interface of the flexible substrate and the silicate bonding layer, or may be diffused through the flexible substrate by placing the microelectronics substrate in an environment with a gaseous solvent.

Finally, the flexible electronics stack is mechanically removed from the carrier via the application of an external load to the flexible substrate material. The external load can be applied via a vacuum roller, a mechanical grip on the flexible substrate material, or a wedge driven between the silicate bonding layer and the flexible substrate. During the removal of the flexible substrate from the carrier, the solvent chosen for dissolving the silicate bonding layer is pulled toward the releasing interface between the flexible substrate and the silicate bonding layer via capillary action. This serves to dissolve any remaining portion of the silicate bonding layer not yet exposed to the solvent and to reduce the adhesive force between the actively delaminating flexible substrate and the silicate bonding layer.

With reference to FIG. 1, a cross-sectional view of a microelectronics substrate, generally 100, is illustrated. Microelectronics substrate 100 comprises a carrier 110, such as a glass panel or silicon wafer, upon which a silicate bonding layer 120 is disposed. Dispensed upon the silicate bonding layer 120 is the flexible substrate 130. The flexible substrate 130 may be formed from a flexible substrate material (e.g., a pre-polymer solution) dispensed atop the silicate bonding layer 120 and cured to form the flexible substrate 130. The flexible substrate 130 may include polyimides, polysulfides, polyesters, or any other flexible substrate on a surface of which microelectronics are capable of being fabricated.

Figure 2:
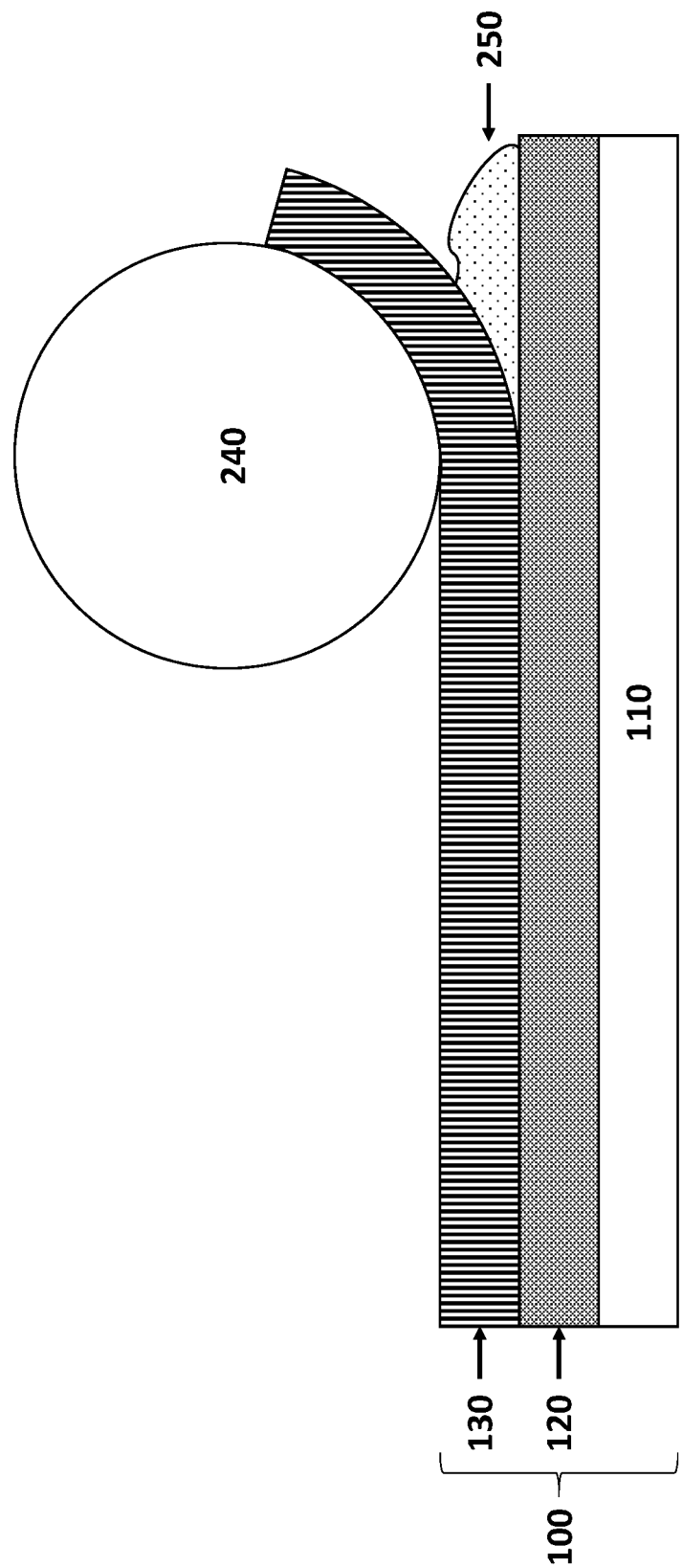
FIG. 2 is a side view of the microelectronics substrate of FIG. 1 where a vacuum release roller has removed an edge of the flexible substrate from the carrier, and an initial solvent for the silicate bonding layer has been reintroduced.

Now referring to FIG. 2, a cross-sectional view of the microelectronics substrate 100 of FIG. 1 is illustrated as the silicate bonding layer 120 is exposed so that a solvent 250 may be added to resolvate the silicates in the silicate bonding layer 120. The carrier 110 and silicate bonding layer 120 are separated from the flexible substrate 130 via a mechanical excision, micromachining, or similar mechanical process which exposes the silicate bonding layer to a sufficient degree so that it may be contacted with the solvent 250. After introduction of a release technique, such as a vacuum roller 240, the silicate bonding layer can be resolvated via the addition of solvent 250 to reform the silicate solution at the boundary between the silicate bonding layer 120 and the flexible substrate 130, which reduces the force used to remove the flexible substrate from the silicate bonding layer 120 and carrier 110. For example, the force used to remove the flexible substrate 130 may be less than 1 kgf/m.

Figure 3:
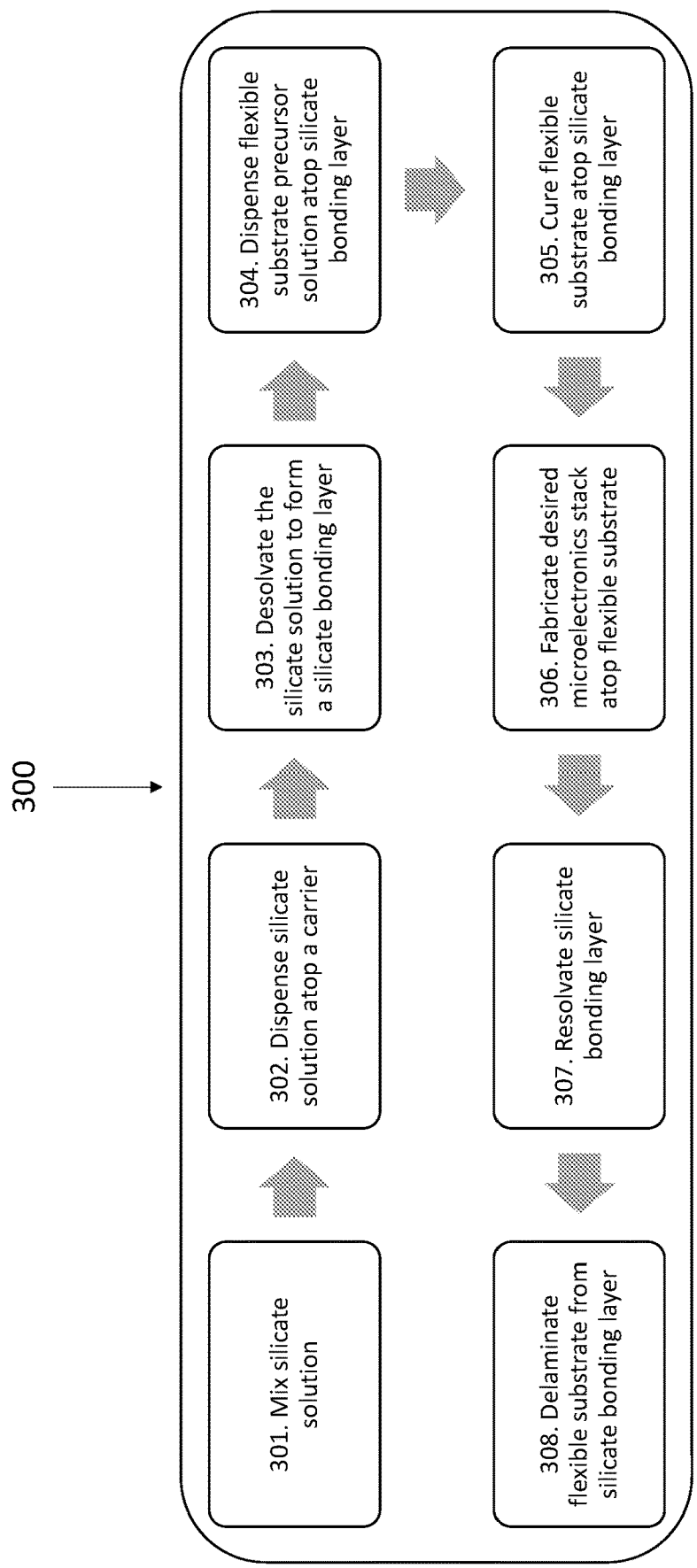
FIG. 3 is a flow-chart of a manufacturing process of the flexible substrate using silicate bonding layers.

FIG. 3 is a flow-chart of a manufacturing process 300 for the temporary bonding of a flexible substrate to a carrier. At block 301, a silicate solution is mixed, and, at block 302, the silicate solution is filtered and dispensed atop the carrier, such as a glass panel or silicon wafer. By way of example, the silicate solution may be between 0.01 percent and 50 percent by weight silicate compound.

At block 303, the silicate solution is desolvated to remove the excess solvent and form a silicate bonding layer. Next, at block 304, a flexible substrate material solution is filtered and dispensed upon the silicate bonding layer, after which, at block 305, the flexible substrate material solution is cured into the flexible substrate. At block 306, a desired microelectronics stack is fabricated atop the flexible substrate using photolithographic processing technology. Upon completion of the microelectronics stack fabrication, at block 307, an interface between the flexible substrate and the silicate bonding layer is resolvated to form a silicate solution at the interface between the silicate bonding layer and the flexible substrate. Finally, at block 308, the flexible substrate is mechanically removed from the carrier.

EXAMPLE 1

To a fluid reservoir, 85 g of deionized $H_2O$ and 25 g of sodium metasilicate ($Na_2SiO_3$) were added. The solution was stirred vigorously until the sodium metasilicate was completely dissolved. Next, the sodium metasilicate solution was filtered through a nylon filter membrane (0.2 μm pore) and dispensed directly atop a carrier glass panel. The solution was spun at 500 RPM for 60 s at an acceleration of 1000 RPM/s. The glass panel was then removed from the spin coater and placed in an oven at 125° C. for 10 minutes to dehydrate the sodium metasilicate.

In a separate fluid reservoir, the multifunctional thiol monomer Tris[2-(3-mercaptopropionyloxy)ethyl] isocyanurate (1 mol eq.) and the multifunctional co-monomer Tris (4-hydroxyphenyl)methane triglycidyl ether (1 mol eq.) were added, and the fluid reservoir was sealed. The sealed fluid reservoir was placed into a rotary mixer and mixed at 2350 rotations per minute (RPM) for 5 minutes. The fluid reservoir was removed from the mixer, opened, and 1.5 wt % of the catalyst tripropylamine was pipetted dropwise into the mixed monomer solution at room temperature (about 25° C.). The fluid reservoir was again sealed, placed into the rotary mixer and mixed at 2350 RPM for an additional 5 minutes. Finally, the fluid reservoir was again removed from the mixer, opened, and the organic solvent tetrahydrofuran was added until the final solution was a 92.5% (v/v) solid-fraction monomer solution.

The monomer solution mixture was mounted to a slot-die coating tool and processed into a thin-film atop the bilayer of the glass panel carrier and sodium silicate bonding layer via a slot-die coating technique. The cast monomer solution was introduced to a curing oven at 65° C. to initiate the polymerization, as well as evaporate the excess tetrahydrofuran, and baked for at least 1 hour, yielding the flexible substrate and forming the microelectronics stack for later use in microfabrication.

After microfabrication, one of the edges along the short axis of the flexible substrate was mechanically excised from corner to corner, revealing the interface between the sodium metasilicate layer and the flexible substrate. 1 mL of deionized $H_2O$ was introduced to this interface and the free edge of the flexible substrate was affixed to a tensile grip. The flexible substrate was then pulled away from the carrier at a rate of 50 mm/min, ensuring that the tensile force never exceeded 1 kgf/m.

The above-disclosed embodiments have been presented for purposes of illustration and to enable one of ordinary skill in the art to practice the disclosure, but the disclosure is not intended to be exhaustive or limited to the forms disclosed. Many insubstantial modifications and variations will be apparent to those of ordinary skill in the art without departing from the scope and spirit of the disclosure. For instance, although the flowchart depicts a serial process, some of the steps/processes may be performed in parallel or out of sequence, or combined into a single step/process. The scope of the claims is intended to broadly cover the disclosed embodiments and any such modification.

What is claimed is:

1. A microelectronics substrate comprising:
   a carrier,
   a silicate bonding layer deposited on the carrier, and
   a flexible substrate disposed adjacent to the silicate bonding layer, wherein the flexible substrate is bonded to the silicate bonding layer; wherein the silicate bonding layer is hydrated or solvated; wherein the microelectronics substrate comprises a peel strength between the flexible substrate and bonding layer; wherein the peel strength between the flexible substrate and the silicate bonding layer is below 1 kgf/m but greater than 0 kgf/m.

2. The microelectronics substrate of claim 1, wherein the carrier is a glass panel, a silicon wafer, or any material presenting a silicon oxide surface.

3. The microelectronics substrate of claim 1, wherein the silicate bonding layer comprises a silicate selected from the group consisting of lithium silicate, sodium silicate, potassium silicate, rubidium silicate, cesium silicate, francium silicate, and any combination thereof.

4. The microelectronics substrate of claim 1, wherein the silicate bonding layer comprises a silicate selected from the group consisting of beryllium silicate, magnesium silicate, calcium silicate, strontium silicate, barium silicate, radium silicate, and any combination thereof.

5. The microelectronics substrate of claim 1, wherein the silicate bonding layer comprises an alkali metal silicate, an alkaline earth metal silicate, or any combination thereof.

6. The microelectronics substrate of claim 1, wherein the silicate bonding layer is formed from a silicate solution that is between 0.01 percent and 50 percent by weight silicate compound.

7. The microelectronics substrate of claim 1, wherein the flexible substrate is an organic film deposited from a resin or varnish solution.

8. The microelectronics substrate of claim 1, wherein the flexible substrate is selected from the group consisting of polyimides, polysulfides, polyesters, and any combination thereof.

* * * * *